United States Patent [19]
Bai et al.

[11] Patent Number: 5,665,493
[45] Date of Patent: Sep. 9, 1997

[54] GATED RECORDING OF HOLOGRAMS USING RARE-EARTH DOPED FERROELECTRIC MATERIALS

[75] Inventors: Yu Sheng Bai; Ravinder Kachru, both of Redwood City; Lambertus Hesselink, Woodside; Roger M. Macfarlane, Menlo Park, all of Calif.

[73] Assignee: SRI International, Menlo Park, Calif.

[21] Appl. No.: 538,704

[22] Filed: Oct. 3, 1995

[51] Int. Cl.$^6$ .................. G03H 1/02; G03H 1/04
[52] U.S. Cl. .................. 430/1; 430/2; 359/3; 359/7; 365/117
[58] Field of Search .................. 430/1, 2, 290, 430/495; 359/1, 3, 7, 35; 365/117

[56] References Cited

U.S. PATENT DOCUMENTS

| | | | |
|---|---|---|---|
| 3,922,061 | 11/1975 | Glass et al. | 350/3.5 |
| 3,997,350 | 12/1976 | Ikeo et al. | 430/1 |
| 4,052,119 | 10/1977 | Williams et al. | 430/1 |
| 4,187,109 | 2/1980 | Megumi et al. | 430/2 |
| 4,339,513 | 7/1982 | Alvarez et al. | 430/1 |
| 4,505,536 | 3/1985 | Huignard et al. | 350/3.64 |
| 4,728,165 | 3/1988 | Powell et al. | 350/3.64 |
| 4,921,328 | 5/1990 | Seth | 350/96.34 |
| 4,927,220 | 5/1990 | Hesselink et al. | 350/3.64 |
| 4,953,924 | 9/1990 | Redfield et al. | 350/3.64 |
| 5,335,098 | 8/1994 | Levya et al. | 359/7 |
| 5,491,570 | 2/1996 | Rakuljic et al. | 359/7 |

OTHER PUBLICATIONS

Grum et al. "Optical Radiation Measurements" (© 1979) p. 147.
Svelto "Principles or Lasers" (© 1989) p. 373.
Gulanyan et al., Sov. J. Quantum Electron., 9(5) (May 1979) pp. 647–649.
Linde, D. von der, Glass, A. M., and Rodgers, K. F., "Multiphoton Photorefractive Processes for Optical Storage in LiNbO$_3$," pp. 155–157, Applied Physics Letters, vol. 25, No. 3, Aug. 1, 1974.

(List continued on next page.)

*Primary Examiner*—Martin Angebranndt
*Attorney, Agent, or Firm*—Hickman Beyer & Weaver, LLP

[57] ABSTRACT

Rare earth doped ferroelectric materials are disclosed as reversible holographic recording medium (25) for use in two-photon recording systems. Such rare earth elements provide long-lived electronic states intermediate the ferroelectric material's valence and conduction bands. In some cases, these rare earth intermediate states have a sufficiently long life that low-power continuous wave ("cw") lasers (1) can be used to record interference patterns on them. Thus, two-photon holographic recording systems are also disclosed which do not require high-power, short pulse length, mode-locked or Q-switched lasers. Rather, the disclosed holographic recording systems employ cw lasers such as diode lasers. The rare earth dopants include praseodymium, neodymium, dysprosium, holmium, erbium, and thulium. These dopants provide ions having 4f excited states that give rise to absorptions in the near infra-red and visible spectral regions and typically have lifetimes on the order of 0.1 to 1 milliseconds.

The disclosed two-photon holographic recording systems provide for absoption of a first photon which excites electrons of a holographic recording medium to a rare-earth intermediate state. Thereafter, upon absorption of a second photon, the electrons are promoted to the medium's conduction band where they are arranged according to the interference pattern provided by the recording system.

23 Claims, 5 Drawing Sheets

OTHER PUBLICATIONS

Linde, D. von der, Glass, A. M., and Rodgers, K. F., "High–Sensitivity Optical Recording in KTN by Two–Photon Absorption," pp. 22–24, Applied Physics Letters, vol. 26, No. 1, Jan. 1, 1975.

Vormann, H. and Kratzig, E., "Two Step Excitation in LiTaO3:Fe for Optical Data Storage," Solid State Communications, vol. 49, No. 9, pp. 843–847, 1984.

Ming, Ye, Kratzig, E., and Orlowski, R., "Photorefractive Effects in LiNbOa:Cr Induced by Two–Step Excitation," Phys. Stat. Sol, (a) 1985. vol. 92.

Hanna, D.C., Tropper, A.C., and Large, A.C., "Optical Absorption and Luminescence of $Tm^{3+}$–doped $LiNbO_3$ and $LiNbO_3$ (MgO) Crystals," Journal of Luminescence, 55, pp. 253–263, 1993.

Zhang, Guilan, Ying, Xiaoying, Yao, Leming, Chen, Ting, and Chen, Huanchu, "Spectroscopic investigation of $Pr^{3+}$ Luminescence in $Sr_xBa_{1-x}Nb_2O_6$ Crystal," Journal of Luminescence, 59, pp. 315–320, 1994.

Johnson, L.F. and Ballman, A.A., "Coherent Emission from Rare–Earth Ions in Electro–Optic Crystals," Journal of Applied Physics, vol. 40, No. 1, pp. 297–302, Jan. 1969.

Winnacker, A., Shelby, R.M., and Macfarlane, R.M., "Photon–Gated Hole Burning: A New Mechanism Using Two–Step Photoionization," Optics Letters, vol. 10, No. 7, Jul. 1985.

Bjorklund, G.C., Burland, D.M., and Alverez, D.C., "A Holographic Technique for Investigating Photochemical Reactions," pp. 4321–4328, J. Chem. Phys., 73(9), Nov. 1, 1980.

Russu, Antonio N., Vauthey, Eric, Wie, Changjiang, and Wild, Urs P., "Photon–Gated Holography: Triphenylene in a Boric Acid Glass," pp. 10496–10503, J. Phys. Chem., 1991.

Linde, D. von der, Glass, A. M., and Rodgers, K. F., "Optical Storage Using Refractive Index Changes Induced by Two–Step Excitation," Journal of Applied Physics, vol. 47, No. 1, Jan. 1976.

"The Physics of Optical Recording," pp. 96 to 110, K.–Schwartz, Springer–Verlog, 1993.

MacFarlane, Roger, M., "Optical Spectroscopy of Photorefractive materials for holographic storage applications," Abstract MB1, Supplement to Optics & Photonics News, Jul. 1995.

GATED RECORDING OF HOLOGRAMS USING RARE-EARTH DOPED FERROELECTRIC MATERIALS

This invention was made with government support under agreement number MDA972-94-2-0008 (ARPA Order No. A576) awarded by the Advanced Research Projects Agency. The government has certain rights in this invention.

Description

1. Technical Field

This invention relates to holographic recording media. More particularly, the invention relates to holographic recording media including poled single crystal ferroelectric materials doped with rare earth elements.

2. Background Art

Holographic recording systems hold forth the promise of very high data storage densities and parallel recording and reading capabilities. It was recognized by the early 1960s that holographic recording media could, in theory, provide a much greater data storage density than magnetic recording media and other conventional recording media. Such high densities are attributable, in part, to the holographic storage media's ability to store information in three dimensions. Thus, the theoretical storage capacity for a volume hologram varies approximately as medium volume divided by the cube of the recording beam wavelength ($V/\lambda^3$). So, for a wavelength of 500 nanometers, the storage capacity for a volume hologram is on the order of $10^{12}$ to $10^{13}$ bits/cm$^3$, compared to $10^8$ bits/cm$^2$ for two-dimensional optical storage media, such as CD-ROMs.

In holographic recording systems, a source of monochromatic coherent radiation is split into (1) an "object beam" which is spatially modulated by a two-dimensional grid (or data source) containing the information to be recorded, and (2) a "reference beam" which is unmodulated. These two beams are then directed onto a single region of a holographic recording medium, where they interact to generate an interference pattern. The holographic recording medium is made from a light sensitive material that records the resulting interference pattern, and thereby stores the information provided on the grid. An image of the recorded information can be constructed from the recorded interference pattern by illuminating the medium with a "read beam." The read beam should have mostly the same characteristics as the reference beam used to record the hologram.

Ferroelectric materials have been investigated as potential holographic recording media. Ferroelectric materials appear to be promising candidates because they can maintain electric dipole domains, even in the absence of an applied electric field. In such materials, incident radiation (from, e.g., an optical interference pattern) promotes electrons from illuminated areas to a conduction band where they may diffuse away from the illuminated areas. Some of these mobile electrons fall from the conduction band back into stationary traps. The electrons in the illuminated areas continue to be promoted to the conduction band at a much greater rate than the electrons in the dark areas. Thus during illumination, the concentration of electrons gradually increases in the dark areas and gradually decreases in the light areas. When the radiation interference pattern is removed, the electrons are no longer promoted to the conduction band by radiation, but do remain trapped at the same spatial locations that they assumed during illumination. Thus, the ferroelectric material can record an optical interference pattern in the form of a spatial distribution of electrons. In some ferroelectric materials (sometimes referred to as "photorefractive" materials), this spatial distribution of electrons causes a corresponding spatial distribution in refractive index which can be read by directing a read beam onto the recorded ferroelectric material as mentioned above.

Ferroelectric materials are particularly attractive holographic storage media because they can be reversibly used for recording; i.e., they can be erased and rerecorded many times. Many competing holographic recording media store information only irreversibly in the manner of a CD-ROM.

Unfortunately, ferroelectric materials often can be too easily erased—particularly during the process of reading the recorded interference pattern. As mentioned, to read the recorded medium, radiation must be directed onto it. And the reading radiation must be of the same wavelength as the radiation used to record the data image. Thus, the photon energy of the read beam will cause some of the electrons in the ferroelectric recording medium to reenter the conduction band (just as they did during recording) where they diffuse to a uniform distribution, thereby erasing the interference pattern.

In an effort to overcome this problem, it has been proposed to use a "two-photon" recording procedure, so named because it requires two photons to excite an electron to the ferroelectric's conduction band. It has been shown that two-photon recording can be accomplished by illuminating the ferroelectric medium with a "gating" beam at one wavelength and a read/write beam at a second wavelength. See, for example, D. von der Linde et at., "Multiphoton photorefractive processes for optical storage in LiNbO$_3$" Appl. Phys. Lett. 25, 155 (1974). The two wavelengths are chosen such that photons at both wavelengths have insufficient energy, by themselves, to promote electrons to the conduction band. However, the sum of the photon energies for the two wavelengths is sufficient to effect the promotion. In application, a first photon excites an electron to an "intermediate" electronic state reasonably close to the conduction band. Then while the electron is temporarily residing in such an intermediate energy state, a second photon (typically of a different wavelength than the first wavelength) promotes it to the conduction band where it diffuses and becomes trapped to record the interference pattern as described above.

This two-photon process provides a more stable hologram than the "single-photon" process in which only a single photon is required to promote an electron into the conduction band. In such single-photon systems, the photons provided by the read beam promote the electrons making up the recorded interference pattern to the conduction band where they redistribute themselves and thereby erase the stored information. In the two-photon recording systems, however, the read beam will have an intensity and photon energy chosen to make single-photon promotion impossible and two-photon (of the same wavelength) promotion unlikely. Thus, a holographic recording medium recorded by a two-photon process can be read many times without erasure.

It was realized early on that the two-photon process' reliance on an intermediate energy state below the conduction band posed its own problem. Without special treatment of the ferroelectric recording medium, such states were extremely short lived. As such, the light sources required to promote electrons to the conduction band would have to be of extremely high power (at least on the order of a gigawatt/cm$^2$) and therefore of extremely short pulse duration (on the order of 10 picoseconds). Such constraints would be unworkable for commercial systems. To enhance the two-photon transition probability and thereby relax these constraints, subsequent work employed ferroelectric materials doped with transition metal ions (e.g., iron, chromium, and copper ions). Such ions provided relatively long-lived intermediate electronic states (typically on the order of 100 nanoseconds) positioned between the ferroelectric material's valence and conduction bands.

While two-photon recording procedures relying upon such doped ferroelectrics have been recognized as an advance in the march toward a commercial holographic recording system, they still required a light source having an unacceptably high power and short pulse length. In U.S. Pat. No. 3,922,061 issued to Glass et al.—which describes some of the early work on two-photon recording—it is stated that such light source should be a mode-locked or Q-switched laser having "a minimum peak intensity of 1 megawatt/$cm^2$". The patent further suggests that for some two-photon systems, lasers of 10 to 100 gigawatts/$cm^2$ may be required (see column 9, lines 1–12). Unfortunately, such power requirements coupled with mode-locking or Q-switching are incompatible with a low cost, reliable storage system.

Thus, there exists a need for an improved reversible holographic recording system which does not require high-power Q-switched or mode-locked lasers and which resists erasure during the reading process.

DISCLOSURE OF THE INVENTION

To meet this need, the present invention provides rare earth doped ferroelectric materials as holographic recording media for use in two-photon read/write systems. In comparison to transition metal dopants used in the prior art, the rare earth elements used in this invention provide longer-lived intermediate electronic states. In some cases, these rare earth intermediate states have a sufficiently long life and low energy that low-power continuous wave ("cw") lasers can be used to record interference patterns on them. In fact, infra-red laser diodes can be used in particularly preferred media. Thus, this invention overcomes the problems of requiring high-power, short pulse length, mode-locked or Q-switched lasers. For the first time, the possibility of a reliable, inexpensive, reversible holographic recording system appears within reach.

An important aspect of this invention is the identification of certain rare earth elements having intermediate electronic states suitable for recording systems employing low-power cw lasers. These rare earth dopants include, at least, praseodymium, neodymium, dysprosium, holmium, erbium, and thulium. Each of these elements provide ions having 4f excited states that give rise to absorptions in the near infra-red and visible spectral regions and typically have lifetimes on the order of 0.1 to 1 milliseconds. Particularly preferred rare earth dopants are neodymium and thulium which have absorptions in the frequency range of commercial semiconductor lasers.

In the media of this invention, like other two-photon recording media, absorption of a first photon excites electrons of the medium to an intermediate state. Thereafter, upon absorption of a second photon, the electrons are promoted to the medium's conduction band where they diffuse before becoming trapped in an arrangement corresponding to the interference pattern provided by the recording system. Unlike the prior two-photon systems, the first and second photons can be provided by low-power (preferably less than 1000 watts/$cm^2$) commercially available cw lasers such as the type used in commercially available optical systems such as CD readers (typically on the order of 10 milliwatts).

In one aspect, the present invention provides a holographic recording system that can be characterized as including the following elements: (1) a holographic recording medium including a ferroelectric material doped with a rare earth element; (2) a first radiation source providing coherent monochromatic radiation which is first divided into a reference beam and a spatially modulated object beam and then recombined to form an interference pattern on a first region of the holographic recording medium; and (3) a second radiation source providing a gating beam which is optically coupled to a second region of the holographic recording medium. The first and second regions of the recording medium should be at least partially coextensive with one another. Further, the first and second radiation sources should be chosen so that their respective photons together promote electrons of the holographic recording medium to a conduction band by a two-photon process. In this manner, the system records the interference pattern in the holographic recording medium. In general, one of the radiation sources should be chosen to produce radiation of a frequency in resonance with a strongly absorbing region of the rare earth dopant's absorption spectra.

Many variations on this basic theme may be provided. For example, in some cases radiation from the first and second radiation sources will have the same wavelength. In such cases, the two-photons necessary to promote an electron to the conduction band may be provided by a single radiation source—i.e., the first and second light sources are the same. This is known as a "one-color two-photon" system. More commonly, two different radiation sources ("two colors") will be employed: one of which provides the object and reference beams, and the other of which provides photons used exclusively to promote electrons to the conduction band. In some cases, the gating beam will be in resonance with the chosen rare earth absorption region. In other cases, the reference/object beams will be in resonance with that absorption region. In preferred embodiments, the gating beam will have a shorter wavelength than the reference/object beam. This makes erasure more difficult during subsequent read operations—which employ relatively low energy photons at the reference beam wavelength.

In preferred embodiments, the rare earth element is present in the ferroelectric material in a concentration of between about 0.05 and 2% atomic. More preferably, the rare earth element is present in the ferroelectric material in a concentration of between about 0.1 and 1% atomic. Preferably, the ferroelectric host for the rare earth dopant is one of lithium niobate, potassium lithium niobate, lithium tantalate, barium titanate, strontium barium niobate (SBN), lead barium niobate (PBN), and barium strontium potassium sodium niobate (BSKNN). One specific recording medium employs the rare earth element praseodymium in strontium barium niobate, in which the ratio of strontium to barium is about 60:40. In such systems, the gating beam or the object/reference beams should have a wavelength of about 600 nanometers (which is in resonance with the $Pr^{3+}$ 4f absorption peak).

In another aspect, the present invention provides a holographic recording medium of the chemical composition described above. This medium can be characterized as including (1) a ferroelectric material doped with a rare earth element; and (2) an antireflective layer coating its outer surfaces. Further, the ferroelectric material should be a poled single crystal. Suitable antireflective coatings include magnesium fluoride, magnesium oxide, beryllium oxide and other materials well-known in the art for this function.

A third aspect of the invention provides a method of writing to a holographic recording medium (a ferroelectric material doped with a rare earth element). Such method can be characterized as including the following steps: (1) separating a first radiation beam of a first wavelength into a reference beam and a spatially modulated object beam; (2) combining the reference beam and the spatially modulated object beam to form an interference pattern on a first region of the holographic recording medium; and (3) directing a gating radiation beam containing at least a second wavelength onto a second region at least partially coextensive with the first region of the holographic recording medium. Photons of the first and second wavelengths together promote electrons of the holographic recording medium to a conduction band by a two-photon process such that the interference pattern is recorded in the holographic recording medium. In general, the character of the recording medium and the gating, reference, and object beams used in this method are as described above in the context of the system aspect of this invention.

The methods of this invention allow for angular and frequency multiplexing. In angular multiplexing, the step of combining the reference beam and the spatially modulated object beam to form an interference pattern is conducted at a defined first angle with respect to the recording medium. Thereafter, the reference beam and a second spatially modulated object beam are combined at a second defined angle, different from the first defined angle, to form a second interference pattern which is recorded on the holographic recording medium. In this manner two or more "slices" of two-dimensional data are recorded at slightly different angles on the same holographic recording medium.

In frequency multiplexing, the method includes steps of (1) separating a third radiation beam of a third wavelength, different from the first wavelength, into a second reference beam and a second spatially modulated object beam; and (2) combining the second reference beam and the second spatially modulated object beam on the holographic recording medium. This is done in a manner that produces an interference pattern of radiation from the third radiation beam that is recorded in the holographic recording medium together with the interference pattern of the first radiation beam. Preferably a gating beam is used to fix the interference pattern of the third radiation beam.

These and other features and advantages of the present invention will be presented in more detail in the following detailed description of the invention and the associated figures.

BEST MODES FOR CARRYING OUT THE INVENTION

1. Holographic Recording

Figure 1:
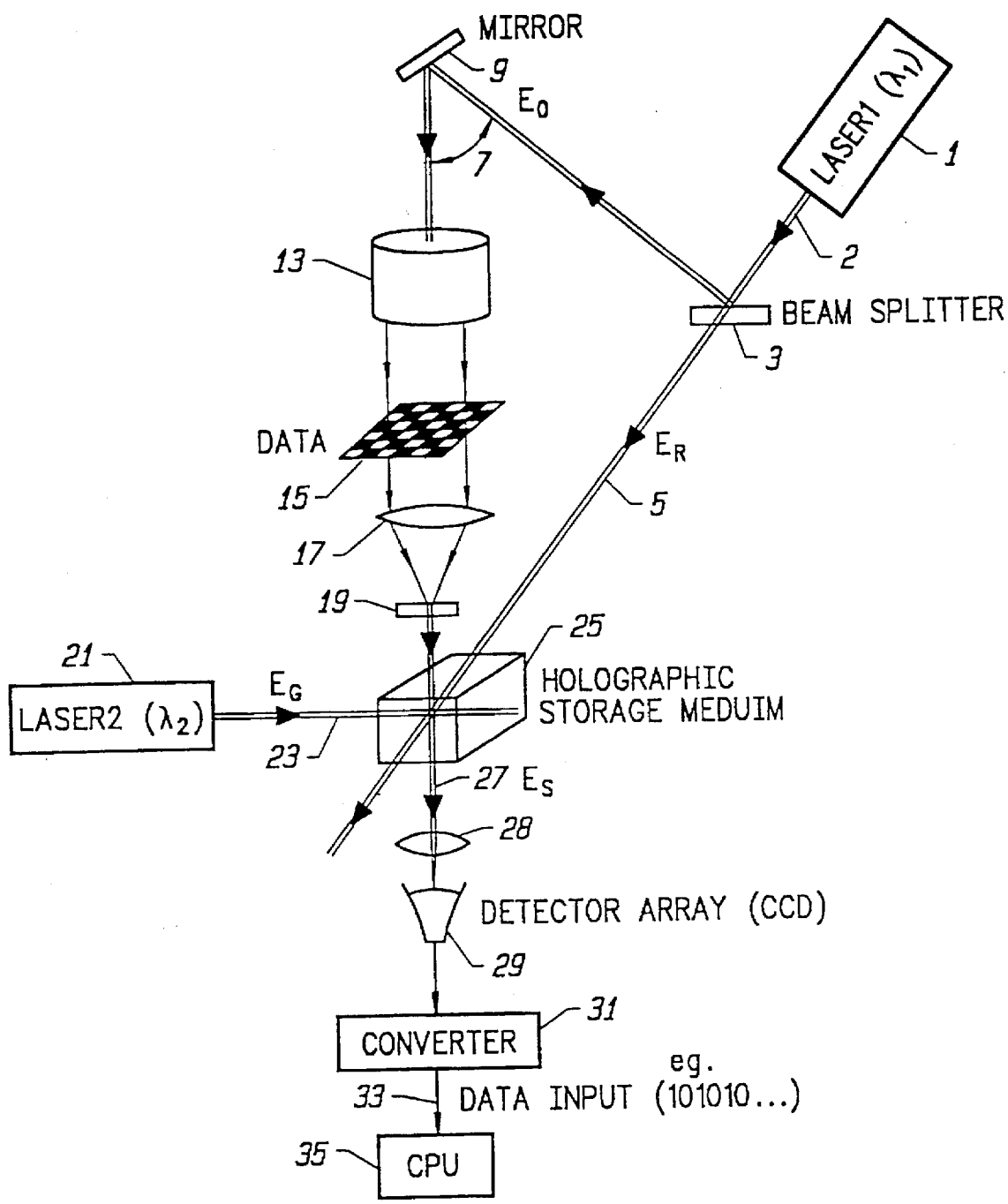
FIG. 1 is a schematic representation of a holographic storage apparatus to read and write information on a holographic storage medium in accordance with this invention.

FIG. 1 presents a preferred holographic data recording apparatus of this invention, such as may be used with a high speed computer. A first coherent light source 1 puts out a beam of monochromatic light 2 of a first wavelength ($\lambda_1$). The beam of monochromatic light 2 is made incident on a beam splitter 3 which reflects approximately half of the monochromatic light to form an object beam ($E_O$) 7 and passes the remainder of the monochromatic light to form a reference beam ($E_R$) 5. The object beam 7 may be directed through various optical elements, such as, for example, a beam expanding element 13, and then towards a representation of data to be stored 15, shown in this illustration as a two-dimensional sheet of alternating spaces of light and dark meant to represent a page of binary information. The object beam 7, which is scattered from the data representation 15, is collected and recollimated by a second set of optical elements, such as, for example, a second lens system, represented here by a second lens 17, and a deflector element 19. The scattered object beam 7 now contains the information in data representation 15 in the form of amplitude and phase variations with respect to the reference beam 5.

Although the data object is shown as a two-dimensional sheet 15 of binary information in FIG. 1, in general holographic data storage systems are not so limited. For example, the information to be stored may be analog as well as digital, although digital information will be appropriate for most current computing applications. In addition, the object to be recorded may take many forms—each of which spatially modulates incident radiation to produce the object beam. Such spatial modulators are conventional in the art and include, for example, liquid crystal modulators, electro-optic modulators, magneto-optic modulators, and acousto-optic modulators. Such modulators are discussed in "The Physics of Optical Recording" by K. Schwartz, Springer-Verlag, 1993 which is incorporated herein by reference for all purposes.

Both the object beam 7 and the reference beam 5 are made incident on a holographic storage medium 25 and interact so as to create an interference pattern in the storage medium. The holographic storage medium 25 comprises a ferroelectric material doped with a rare earth element as described in more detail below. A second (unmodulated) light, known as a gating beam ($E_G$) 23, of a second wavelength ($\lambda_2$) not equal to $\lambda_1$ and preferably $<\lambda_1$, from a second light source 21 is directed simultaneously on the storage medium 25 with the object beam 7 and reference beam 5. A photon of light with wavelength $\lambda_1$ provides enough energy to electronically excite an ion of the rare earth dopant to an intermediate state, but not enough energy for an electron to enter the ferroelectric material's conduction band. Then a photon of light with wavelength $\lambda_2$ provides the excited rare earth atom with enough energy for its electron to then enter the ferroelectric material's conduction band, where it can move from the regions of high light intensity and become trapped in the regions of low intensity. After the illumination from the first and/or second light beams is removed, and electrons are no longer optically promoted to the conduction band, and thus remain trapped in impurity or defect states of the ferroelectric material, creating a local electric field within the ferroelectric material that leads to an induced refractive index change that is similar to the spatial variations of intensity produced by the interference pattern. As noted, this is sometimes referred to as the photorefractive effect.

In some preferred embodiments, in contrast to the above-described embodiment, the gating beam 23 photons will electronically excite the rare earth dopant to the intermediate state, and the object/reference beam photons will then promote the excited state electron to the conduction band. Either way, $\lambda_2$ and $\lambda_1$ should be chosen in conjunction with the rare earth dopant so that at least one of $\lambda_2$ and $\lambda_1$ is in resonance with an absorption region of the chosen rare earth dopant. In especially preferred embodiments, the absorption region of the rare earth ion will be at a photon energy that can be produced by commercially available solid-state lasers.

To ensure that a meaningful interference pattern is produced the object and reference beams should be phase locked. Thus, these beams generally should be produced by a single coherent laser radiation source. To provide a desired wavelength, the laser radiation may have to be modified as by passing it through a frequency multiplier or other frequency shifting mechanism (e.g., a dye laser). This may be necessary when the object and reference beams are to be in resonance with the dopant absorption peak. Suitable lasers for producing the object and reference beams in accordance with this invention include semiconductor lasers, argon ion lasers, Nd:YAG lasers, etc.

While the object and reference beams should be monochromatic and coherent, the gating beam need not be. Thus, the gating beam need not be produced by a laser and need not even be monochromatic. In general, the gating beam source need only produce radiation in a wavelength range which will promote electrons into the conduction band by a two-photon mechanism (in conjunction with radiation from the object and reference beams). However, the gating beam should not include wavelengths which could promote electrons to the conduction band by a single photon mechanism. Thus, it may be necessary to block some of the shorter wavelength photons from a broad band source from striking the recording medium (by, e.g., a notch filter). Further, if the gating beam is to be in resonance with the a dopant transition, wavelengths outside of the range necessary for this transition will not be useful and it may be desirable to use a laser as the gating beam source.

In preferred embodiments the gating beam intensity should be at most about 1000 watts/cm². More preferably, the intensity should be between about 5 and 200 watts/cm², and most preferably between about 10 and 100 watts/cm². Further, the gating beam intensity will typically be between about 0.5 and 5 times the reference/object beam intensity. Suitable gating beam sources include, for example, xenon lamps, halogen lamps, argon ion lasers, Nd:YAG lasers, etc. In some cases, it may be necessary to filter the radiation from these sources to meet the above constraints.

In some embodiments, a single light source may be employed as a source of the object, reference, and gating beams, such that $\lambda_2 = \lambda_1$. Such systems, sometimes referred to as "one color, two-photon" systems, can have the general arrangement as shown in FIG. 1, but without the use of second radiation source 21. Of course, the photon energy in such systems must be below the energy required to directly promote electrons into the conduction band from the valence band (or other low energy state). Further, the beam used to record the hologram should generally have a higher intensity than the beam used to read the hologram. This reduces the likelihood of promoting electrons to the conduction band during reading—and thereby erasing the hologram. It should be noted that such one-color two-photon systems of this invention resist erasure far better than comparable one-color single photon systems. This is because the erasure rate during reading is proportional to intensity in single photon systems and is proportional to intensity squared in two photon systems. Thus, reducing the read beam intensity (in comparison to the write beam intensity) in two photon systems reduces erasure rate much more dramatically than in single photon systems.

In another alternative embodiment, not shown, a reference beam, an object beam, and a gating beam are all generated by a first coherent light source of a first wavelength. The gating beam is produced by passing radiation from the first light source through a frequency doubler. Some fraction of the radiation exiting the frequency doubler will have a wavelength that is one-half that of the first wavelength. This short wavelength radiation serves as the gating beam which passes with the reference or object beam through appropriate optics and onto the holographic recording medium. Preferably, the radiation exiting the frequency doubler will be directed onto a beam splitter that transmits both components and reflects only one. The reflected monochromatic portion then forms the object beam, and the transmitted component forms the reference beam (long wavelength) and gating beam (short wavelength).

Returning again to FIG. 1, the stored information can be read by blocking the object beam 7 and diffracting off of the recorded interference pattern the reference beam 5 or its equivalent in terms of wavelength and angle of incidence with the storage medium 25. This diffraction creates a scattered beam ($E_S$) 27 which passes through a lens 28 to produce a holographic image of the data representation which then is captured by a detector array 29 such as a charge-coupled device (CCD). Output from the detector array can be converted 31 into a serial binary form 33 suitable to input into standard computer central processing units 35. It should be noted that the reading process is inherently parallel. That is, the individual bits of data (in the case of a digital recording) are all read simultaneously and provided as a two-dimensional array. In conventional single CPU computing systems, the information in this array typically must be at least partially serialized for use with the computer. However, in more advanced parallel processing computer systems, there may be no need to serialize the data image. In fact, holographic storage media may serve as a particularly efficient form of memory for massively parallel computers.

Figure 2:
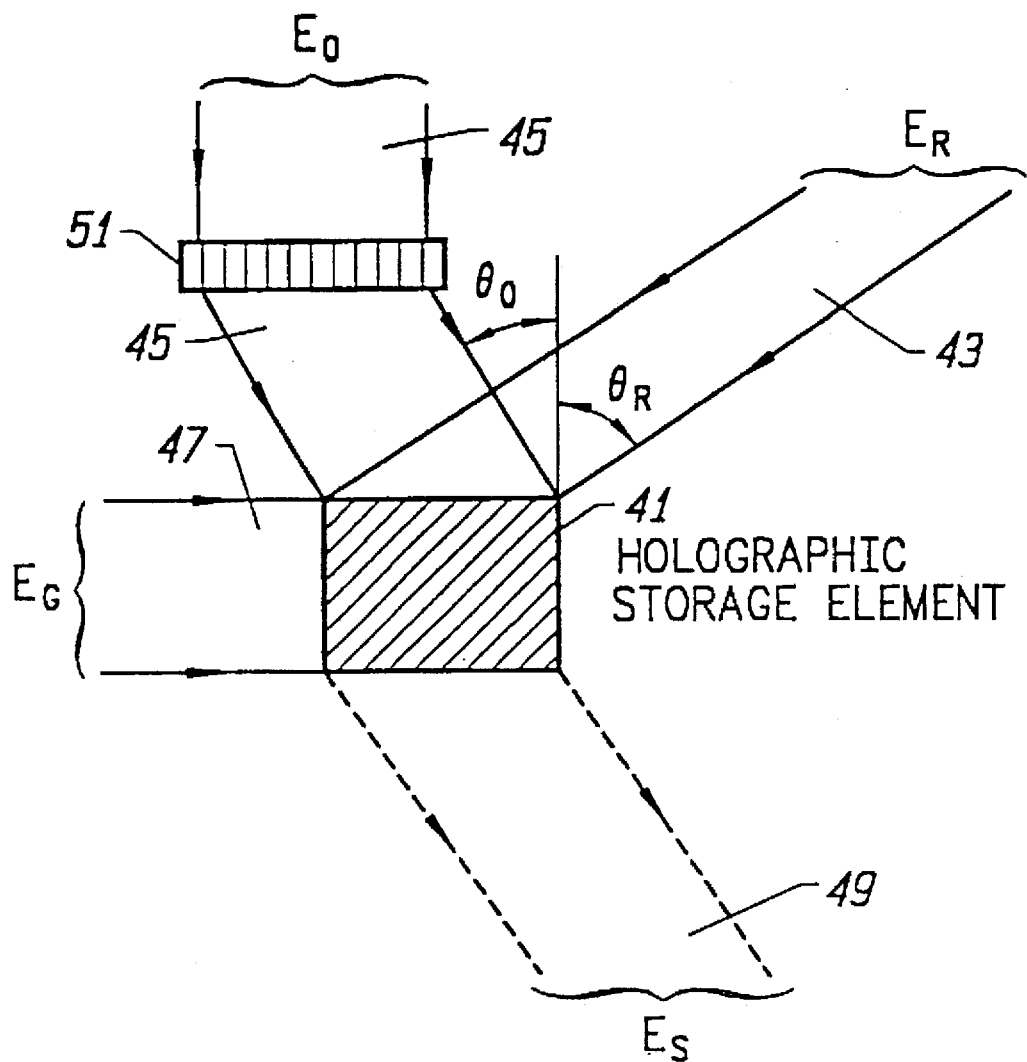
FIG. 2 is a schematic representation of an object, reference, and gating beam incident on a holographic storage element during a writing process in accordance with the invention, and a scattered beam which would result during a reading process.

The systems of this invention may be used to record volume holograms. Such holograms include various "slices" of recorded information overlapping one another within the recording medium. Typically, the various slices of information are each recorded at a different angle by a process known as angular multiplexing. As illustrated in FIG. 2, angular multiplexing is accomplished by storing multiple images within a given recording medium volume by varying the angle of incidence $\theta_R$ of a reference beam 43—and possibly $\theta_O$ of an object beam 45—on a holographic storage medium 41. $\theta_O$ and $\theta_R$ may be controlled by any number of means. A deflector element 51, for example, can be used to control the angle at which the object beam 45 (or the reference beam, not shown) is incident on the storage medium. Alternatively, the orientation of the storage medium could be manipulated to vary $\theta_O$ and $\theta_R$, not shown. The angular resolution of a volume hologram, which determines the number of holograms that can be accommodated in the medium, increases with the thickness of the storage medium. To attain good angular resolution, the thickness of a volume holographic recording medium should be on the order of 0.1 to 10 cm.

In addition to angular multiplexing, a technique known as frequency mulitplexing may be used to record multiple interference gratings in a single holographic recording medium. Frequency multiplexing allows the gratings to be overlaid on one another by storing separate data representations at different wavelengths. Thus, a first data representation can be stored on a holographic recording medium using reference and object beams of one wavelength, and a second data representation can be stored on top of the first data representation using reference and object beams of a different wavelength.

A holographic recording prepared in accordance with this invention may be erased by exposing recording medium to photons having an energy sufficient to promote electrons to the medium's conduction band. Preferably, the radiation will be sufficiently intense that the erasure process can be completed in a short time. For most ferroelectrics (at least those having a band gap of 4 eV or less), intense ultraviolet radiation will serve this purpose. Often, however, an intense focused white light source will be sufficient to erase the recording medium. After a medium is erased, it can, of course, be rerecorded in the manner described above.

2. Holographic Storage Media: Rare Earth Element-Doped Ferroelectrics

The holographic recording media of this invention are, as noted, made from rare earth doped ferroelectric materials. As used herein, the term "ferroelectric" refers to crystals exhibiting an electric dipole moment even in the absence of an external electric field. Thus, in the ferroelectric state, the center of positive charge of a crystal does not coincide with the center of negative charge. Further, a plot of polarization versus electric field for the ferroelectric state shows a hysteresis loop. A crystal in a normal dielectric state usually does not show significant hysteresis when the electric field is slowly increased and then reversed.

Suitable photorefractive, ferroelectric materials for use in the recording media of this invention include (1) perovskites such as $BaTiO_3$, $KNbO_3$, and $KTa_xNb_{1-x}O_3$; (2) oxides such as $LiNbO_3$, $LiTaO_3$; (3) complex oxides with a tungsten bronze structure such as $Sr_xBa_{1-x}Nb_2O_6$ (SBN) (4) non-oxide sulfur iodides such as SbSI, SbSeI, and BiSI; (5) bismuth germanium compounds such as $Bi_{12}GeO_{20}$ and $Bi_{12}SiO_{20}$; and (6) PLZT ceramics such as PbLaZrTi. Examples of preferred photorefractive ferroelectrics include lithium niobate, potassium lithium niobate, lithium tantalate, barium titanate, strontium barium niobate (SBN), lead barium niobate (PBN), and barium strontium potassium sodium niobate (BSKNN). Within this group, the compounds strontium barium niobate and lithium niobate have been found to perform quite well.

The rare earth elements having 4f transitions employed as dopants for the ferroelectric material include most rare earth elements, i.e., praseodymium, neodymium, promethium, samarium, europium, gadolinium, terbium, dysprosium, holmium, erbium, thulium, ytterbium, and lutetium. From among this list, particularly preferred rare earth dopants include at least praseodymium, neodymium, dysprosium, holmium, erbium, and thulium. Each of these elements provide ions having 4f excited states that give rise to absorptions in the near infra-red and visible spectral regions (on the order of 400–1550 nanometers) and typically have lifetimes on the order of 0.1 to 1 milliseconds. For comparison, transition metal elements such as iron and copper—which have been used in prior two-photon holographic recording media—have intermediate electronic state life times on the order of about 0.1 microseconds. Particularly preferred rare earth dopants are neodymium and thulium which have absorptions in the frequency range of inexpensive semiconductor lasers.

As noted, rare earth ion excited states can serve as intermediate states in the two-photon recording process. The relatively long lives of these states significantly reduces the intensity threshold, which allows for the use of continuous wave lasers to affect the two-photon process. An electronic excited state with a lifetime of 0.1 milliseconds requires a threshold intensity of about 1 Watt/millimeter$^2$ to affect the transition, a threshold intensity that approaches the capabilities of currently available diode lasers, such as those used in compact disc players and laser printers, which can emit several tens of milliwatts of coherent, cw-near infra-red and visible radiation. The ability to use small diode lasers represents a significant advance towards the commercial feasibility of holographic date storage.

In preferred embodiments, the rare earth element is present in the ferroelectric material in a concentration of between about 0.05 and 2% atomic. More preferably, the rare earth element is present in the ferroelectric material in a concentration of between about 0.1 and 1% atomic. In the specific embodiment of $Pr^{3+}$ absorption at 600 nanometers, it has been found that $Pr^{3+}$ is preferably employed at a concentration of between about 0.2 and 0.5% atomic in SBN:60. Such concentrations ensure that there will be enough intermediate states to promote electrons to the conduction band by a two-photon process employing relatively modest intensity radiation.

It has been observed that some ferroelectric hosts that may have variable stoichiometries, perform better at one of the particular stoichiometries. For example, it has been found that for praseodymium doped strontium barium niobate, the host material preferably has a strontium to barium ratio of 60 to 40. Materials having a strontium to barium ratio of 75 to 25 do not perform as well.

The rare earth doped ferroelectric single crystals of this invention may be prepared according to conventional methods known in the art or be custom made by certain vendors such as Virgo Optics of Port Richey, Fla., Deltronic Crystal Industries, Inc. of Dover N.J., and Fujien Caatech Crystals, Inc. of Fuzhou, Fujian Peoples Republic of China. Depending upon the nature of the material, growth may be by deposition from the vapor phase (e.g., sputtering, evaporation, ablation, chemical vapor deposition), by bulk process, such as by melt growth, from flux, etc. In general, melt growth involves fusing inorganic components in the correct ratios to form the doped ferroelectric and then pulling a single crystal from the melt. Such techniques are described in, for example, "Development and modification of photorefractive properties in the tungsten bronze family crystals" by Neurgaonkar in Optical Engineering, Vol. 26, pg. 392 et seq., May 1987 which is incorporated herein by reference for all purposes.

The thickness of the holographic recording media should be at least several times $\lambda$, where $\lambda$ is the wavelength of the radiation used to generate the interference pattern. In further preferred embodiments, the holographic recording media will have a thickness of between about 0.1 and 100 millimeters. In the example set forth below, it was found that holographic recording media having dimensions of 5 millimeters by 5 millimeters by 5 millimeters performed quite well.

Further, the recording medium should be coated with an anti-reflective material such as is employed to coat a lens. Such materials include, for example, magnesium fluoride, magnesium oxide, and beryllium oxide. In general, such anti-reflective coatings should be provided on all sides of the holographic recording medium through which radiation will pass. Typically, it will be convenient and desirable to coat all outer surfaces of the medium.

Still further, it will generally be necessary to pole the single crystal ferroelectric recording medium before recording a grating on it. Conventional poling may be carried out generally by use of an applied electric field maintained during cooling of a material through its Curie point to some lower temperature is described in Ferroelectrics, 4, 189 (1972).

3. EXAMPLES

All experiments were performed on a 0.5×0.5×0.5 cm sample of single-crystal praseodymium-doped 60%-strontium, 40%-barium niobate ($Sr_{0.6}Ba_{0.4}Nb_2O_6$; also known as SBN:60), a ferroelectric material hereinafter referred to as Pr:SBN. The nominal concentration of $Pr^{3+}$ in this sample was 0.2% atomic. The Pr:SBN sample used in these experiments was supplied by Rockwell International of California. The sample was poled by applying a 2.5 kilovolt potential across the sample for one-half hour at room temperature.

Example 1

Figure 3A:
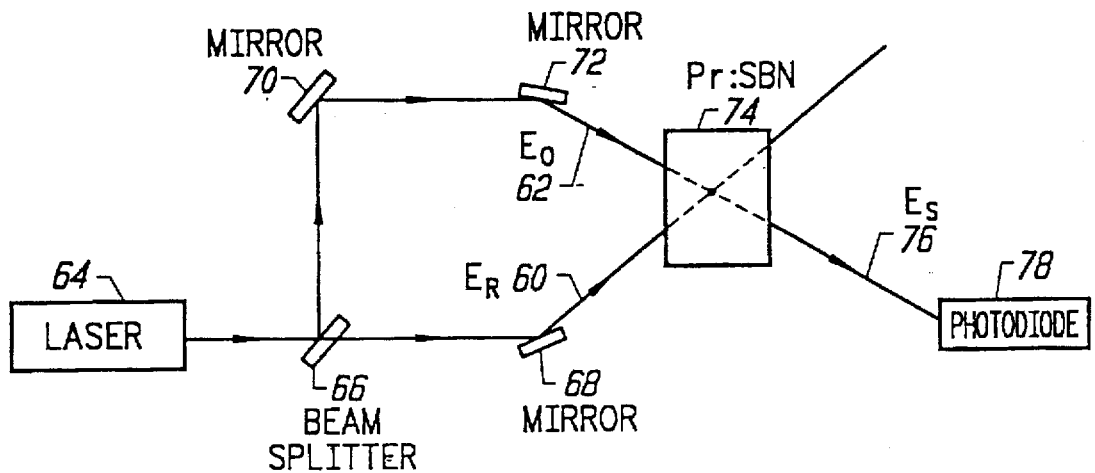
FIG. 3a is a block representation of the experimental setup used for the one-color/two-photon experiments discussed below.

For this experiment, a reference laser beam ($E_R$) 60 and an object laser beam ($E_O$) 62 were focused on the poled single-crystal sample of Pr:SBN 74 to write a holographic grating in the sample, as shown schematically in FIG. 3a. Output from a tunable ring-dye laser (Coherent Model 699-21) 64 with a wavelength range of 580 to 620 nm was split by a beam splitter 66 (reflectance=45%) to produce the reference 60 and the object 62 laser beams. A 200-MHz-center frequency acousto-optic modulator was used to modulate the amplitude of the laser beams so as to allow the growth of the grating to be monitored. The phase of the object beam with respect to that of the reference beam by passing the object beam over a longer path length (as defined by mirrors 70 and 72) than the reference beam (as defined by mirror 68). Thus, when the object and reference beams were recombined on the sample 74, they produced an interference pattern. The holographic grating was written with 200 shots of 2-millisecond laser pulses at a power density of about 1 Watt/millimeter$^2$. The grating was read by blocking the object beam 62 so that only the reference beam 60 would be incident on the sample and diffracted by the holographic grating to produce a scattered beam ($E_S$) 76. The holographic grating was read with laser pulses of 5 microsecond duration and about 1/16 of the laser intensity of the recording laser beams. A silicon photodiode 78 (EG&G Model FND-100) was used to monitor the intensity of the diffracted beam.

The rare earth element dopant was established as being responsible for fixing the recorded information in the sample by the following experimental evidence. A holographic grating written and read at 580 nm, which does not correspond to any $Pr^{3+}$ absorption transition, exhibited rapid erasure of the grating as indicated by the rapid decrease (decay constant=30 s) in diffraction efficiency ($\eta$), defined as the ratio of the diffracted intensity ($I_S$) to the reference beam intensity ($I_R$). This is illustrated by the lower trace in FIG. 4. Similar results were observed when the holographic grating was written and read at 620 nm, which, again, does not correspond to any $Pr^{3+}$ absorption transition. These short lived holographic gratings are believed to result from shallow traps in the bulk single crystal which exist in the crystal's band gap near either the conduction band or the valence band.

Figure 4:
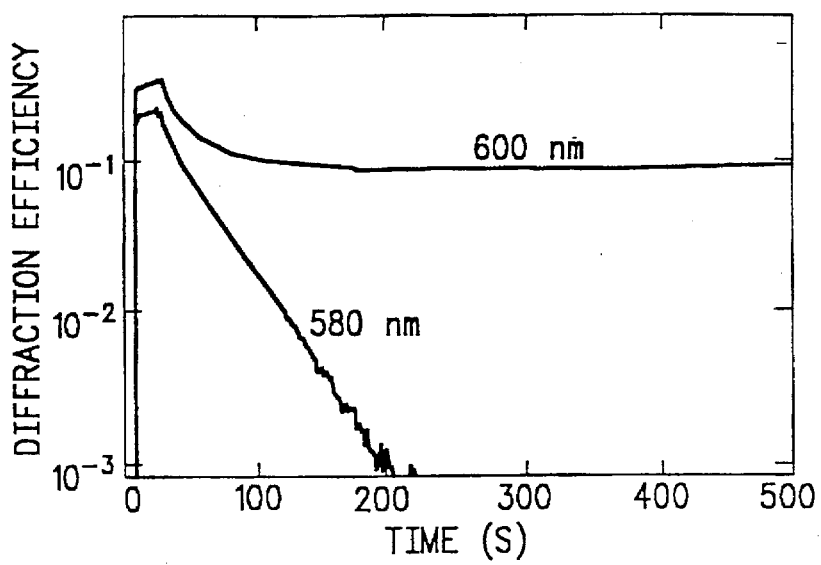
FIG. 4 is a graph depicting the diffraction efficiency as a function of read time of holograms recorded in accordance with the invention at 600 nm and 580 nm.

In contrast, the upper trace in FIG. 4 shows that a holographic grating written and read at 600 nm, which corresponds to the peak $^1D_2$-$^3H_4$ absorption of $Pr^{3+}$, did not exhibit significant erasure upon repeated reading over a period of approximately 8 hours. This observed strong wavelength dependence indicates that the fixing of the grating was due to the $Pr^{3+}$ dopant ions. A grating written with a total laser intensity of 1.4 W/mm$^2$ had a remnant diffraction efficiency of 9.2%, but efficiencies as high as 25% were observed at higher writing intensity.

Example 2

Experiments which suggest a two-photon absorption mechanism was provided by observation of a quadratic relationship between the diffraction efficiency and the incident light intensity. For a one-photon process, $\sqrt{\eta} \propto I \times \Delta t$, so the square root of the remnant diffraction efficiency varies linearly with both incident laser intensity (I) and laser pulse length ($\Delta t$), which is an indicator of laser energy flux. In contrast, for a two photon process, $\sqrt{\eta} \propto I^2 \times \Delta t$, so the square root of the remnant diffraction efficiency varies quadratically with incident laser intensity and linearly with laser pulse length.

Figure 5:
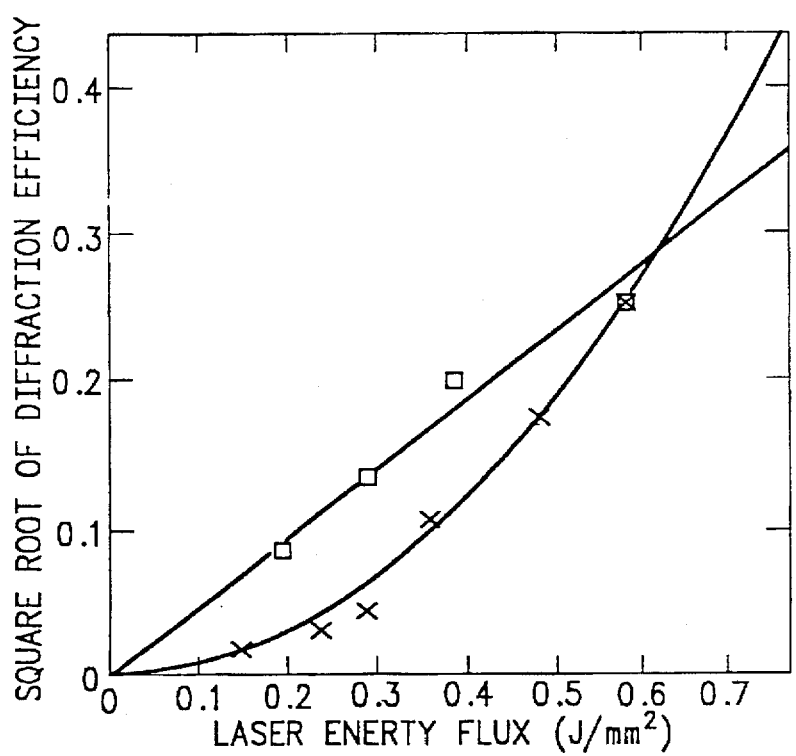
FIG. 5 is a graph showing the dependence of the square root of diffraction efficiency as a function of laser intensity and of laser pulse length.

FIG. 5 shows the intensity and pulse length dependence of the grating formation in Pr:SBN. These data were taken using an experimental setup as described above and shown in FIG. 3a, with a laser wavelength fixed at 600 nm, at the peak of the $^1D_2$-$^3H_4$ absorption of $Pr^{3+}$. The cross points were taken by monitoring the remnant diffraction intensity while varying the laser intensity and keeping the pulse width constant, and the square points were taken at constant laser intensity while varying the pulse width. The curves fitted to these two sets of points clearly demonstrate the quadratic dependence on laser intensity and linear dependence on pulse width (laser flux) indicative of a two-photon process.

Example 3

The two above-described examples can be characterized as one-color/two-photon experiments as two photons of the same wavelength (color) are used to cross the band gap of the bulk material. Unfortunately, reading a hologram written by such a process is not completely nondestructive as the reading must be done at the same wavelength as the writing. Though two-photon absorption can be minimized during the reading process through the use of a relatively low intensity read beam, two-photon absorption across the band gap, which would lead to further charge carrier movement within the conduction band and consequently the unfixing of the hologram, can not be totally eliminated.

Figure 3B:
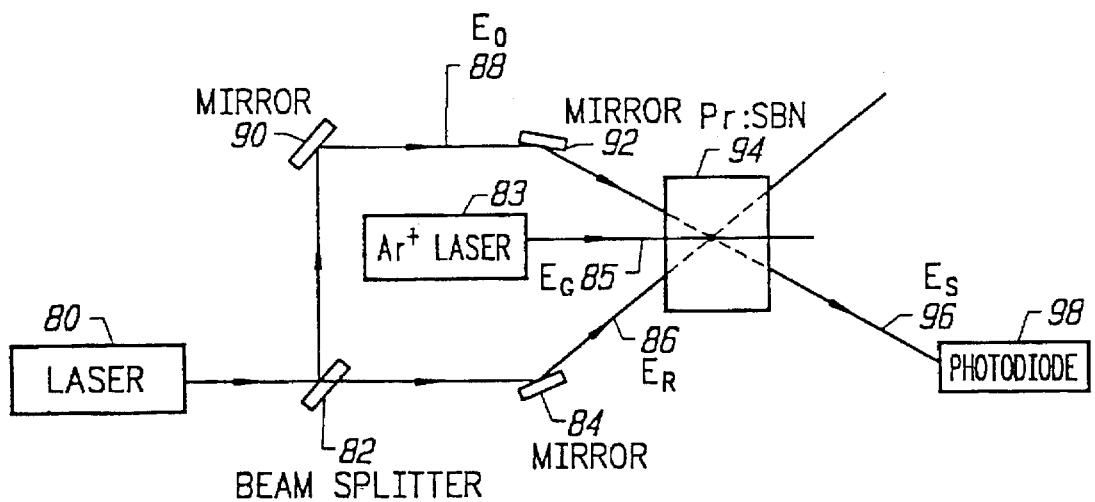
FIG. 3b is a block representation of the experimental setup used for the two-color/two-photon experiments discussed below.

A two-color/two-photon process will at least partially overcome this problem and provide an enhanced diffraction efficiency. In two-color experiments, an experimental apparatus, shown schematically in FIG. 3b, employed an unmodulated gating laser beam ($E_G$) 85 which was directed on a poled single-crystal Pr:SBN sample 94 simultaneously with an object ($E_O$) 88 and a reference ($E_R$) 86 beam to write the grating in the sample material. The gating beam 85 was a laser beam of about 1.0 W/mm$^2$ of the 514.5 nm fixed-wavelength output of an argon ion laser 83 (Coherent Model 200), and the object 88 and reference 86 beams at 600 nm and 0.23 W/mm$^2$ were generated as described above. Specifically, the object ($E_O$) 88 and reference ($E_R$) 86 beams were provided from a tunable laser 80 whose beam was split by a beam splitter 82. The object beam 88 was reflected off of mirrors 90 and 92 and onto sample 94. The reference beam 86 was reflected off of mirror 84 and onto sample 94. As in the one-color experiments, the grating was read by blocking the object beam 88 so that only the reference beam 86 would be incident on the sample and diffracted by the holographic grating to produce a scattered beam ($E_S$) 96. The intensity of beam 96 was measured by a silicon photodiode 98.

Figure 6:
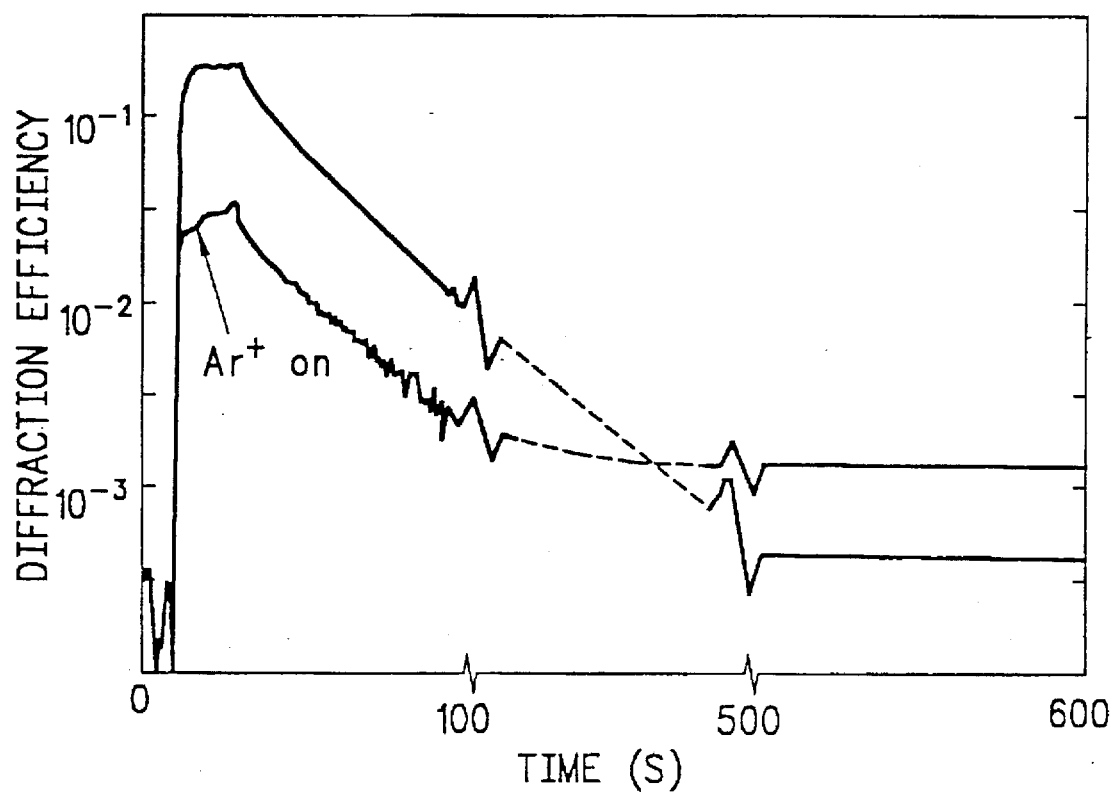
FIG. 6 is a graph showing a four-fold enhancement of diffraction efficiency of gated two-photon writing over ungated two-photon writing of the hologram in accordance with the invention.

As the gating beam provides high energy photons at high intensity, more electrons are fixed in the recorded interference pattern, so that the signal strength in the diffracted intensity ($I_S$) is improved. Evidence of this is seen in FIG. 6, which shows the diffraction efficiency from the two-color experiment to be 4 times greater than that from the one-color experiment.

4. Conclusion

Although the foregoing invention has been described in some detail for purposes of clarity of understanding, it will be apparent that certain changes and modifications may be practiced within the scope of the appended claims. For instance, although the specification has described holographic photorefractive memory, the rare earth doped ferroelectric materials of this invention will be useful in all photorefractive applications involving signal processing, routing, switching, and optical interconnections (see, for example, "Selected Papers on Optical Computing" SPIE Milestone Series, H. John Caulfield and Gregory Gheen, editors, SPIE Optical Engineering Press, 1989, which is incorporated herein by reference for all purposes). In addition, the reader will understand that the rare earth element dopant atoms described herein can be replaced with any other dopant atoms that provide similarly long-lived intermediate electronic states in a ferroelectric material.

What is claimed is:

1. A method of writing to a holographic recording medium containing a ferroelectric material doped with a rare earth element, the method comprising the following steps:

separating a first radiation beam of a first wavelength into a reference beam and an object beam;

spatially modulating the object beam to produce a spatially modulated object beam;

combining the reference beam and the spatially modulated object beam to form an interference pattern on a first region of said holographic recording medium; and directing a gating radiation beam containing at least a second wavelength onto a second region at least partially coextensive with said first region of the holographic recording medium, whereby photons of the first and second wavelengths together promote electrons of the holographic recording medium to a conduction band by a two-photon process such that the interference pattern is recorded in said holographic recording medium, wherein at least one of the first radiation beam and the gating beam is provided at an intensity of at most about 1000 watts/cm$^2$.

2. The method of claim 1 wherein at least one of the first radiation beam and the gating beam is provided by a continuous wave laser.

3. The method of claim 2 wherein both of the first radiation beam and the gating radiation beam are provided by continuous wave lasers.

4. The method of claim 1 wherein the rare earth element doping the ferroelectric material is selected from the group consisting of praseodymium, neodymium, dysprosium, holmium, erbium, and thulium.

5. The method of claim 4 wherein the rare earth element doping the ferroelectric material is praseodymium, neodymium, or thulium.

6. The method of claim 1 wherein the rare earth element is present in the ferroelectric material in a concentration of between about 0.05 and 2% atomic.

7. The method of claim 6 wherein rare earth element is present in the ferroelectric material in a concentration of between about 0.1 and 1% atomic.

8. The method of claim 7 wherein rare earth element is present in the ferroelectric material in a concentration of between about 0.2 and 0.5% atomic.

9. The method of claim 1 wherein the ferroelectric material is selected from the group consisting of lithium niobate, potassium lithium niobate, lithium tantalate, barium titanate, strontium barium niobate, lead barium niobate, and barium strontium potassium sodium niobate.

10. The method of claim 9 wherein the holographic recording medium includes strontium barium niobate doped with praseodymium and wherein at least one of the first and second wavelengths is about 600 nanometers.

11. The method of claim 1 further comprising the following steps:

separating a third radiation beam of a third wavelength, different from said first wavelength, into a second reference beam and a second object beam;

spatially modulating the second object beam to produce a second spatially modulated object beam; and combining the second reference beam and the second spatially modulated object beam to form a second interference pattern that is recorded on said holographic recording medium.

12. The method of claim 1 wherein the step of combining the reference beam and the spatially modulated object beam to form an interference pattern is conducted at a defined first angle with respect to the holographic recording medium, the method further comprising a step of subsequently combining the reference beam and a second spatially modulated object beam at a second defined angle, different from the first defined angle, to form a second interference pattern which is recorded on the holographic recording medium.

13. The method of claim 1 wherein the first and second wavelengths are different from one another.

14. The method of claim 13 wherein said second wavelength is shorter than said first wavelength.

15. The method of claim 1 wherein at least one of the of the first radiation beam and the gating radiation beam is provided by a diode laser.

16. The method of claim 1 wherein the gating radiation beam is provided by an incoherent radiation source.

17. The method of claim 1 wherein the first and second wavelengths are the same.

18. The method of claim 1 wherein photons of the first radiation beam have a first defined photon energy and at least some photons from the gating radiation beam have at least a second defined photon energy, and wherein the sum of the first and second defined photon energies is at least as great enough to promote electrons into the conduction band, but neither the first nor the second defined photon energies is great enough to promote electrons into the conduction band.

19. The method of claim 18 wherein the photons from at least one of the first radiation beam and the gating radiation beam have a frequency in resonance with an intermediate state in the holographic recording medium, said intermediate state being supplied by the rare earth element.

20. The method of claim 1 wherein the ferroelectric material is strontium barium niobate in which the ratio of strontium to barium is about 60:40.

21. The method of claim 1 wherein the holographic recording medium includes an antireflective layer coating its outer surface.

22. The method of claim 1 wherein the ferroelectric material is a poled single crystal.

23. The method of claim 1 wherein the holographic recording medium is substantially rectangular in shape having minimum dimension of at least about 0.1 millimeter.

* * * * *